United States Patent [19]

Ota et al.

[11] Patent Number: 4,775,549

[45] Date of Patent: Oct. 4, 1988

[54] METHOD OF PRODUCING A SUBSTRATE STRUCTURE FOR A LARGE SIZE DISPLAY PANEL AND AN APPARATUS FOR PRODUCING THE SUBSTRATE STRUCTURE

[75] Inventors: Isao Ota, Osaka; Toshio Tatsumichi, Nara; Katsuhiko Kumagawa, Neyagawa; Hiroshi Yamazoe, Katano; Masahiro Nagasawa, Hirakata, all of Japan

[73] Assignee: Matsushita Electric Industrial Co., Ltd., Osaka, Japan

[21] Appl. No.: 810,713

[22] Filed: Dec. 19, 1985

[30] Foreign Application Priority Data

Dec. 19, 1984 [JP] Japan ................................ 59-269020
Feb. 7, 1985 [JP] Japan ................................ 60-22246

[51] Int. Cl.$^4$ ............................................ B05D 3/06
[52] U.S. Cl. ................................. 427/38; 427/43.1; 427/53.1; 427/66; 427/81; 427/109; 427/124; 427/126.3; 427/261; 427/265; 427/294; 427/331; 427/397.7
[58] Field of Search ........................ 427/38, 43.1, 53.1, 427/66, 81, 109, 124, 126.3, 261, 265, 294, 331, 397.7

[56] References Cited

PUBLICATIONS

Matsumoto, Latest Technology of Liquid Crystals-Kogyo Chosa Kai, 1983, pp. 113-119, 156.
Brody, Large Scale Integration for Display Screen-SPIE Proc., vol. 17/1, 1976, pp. 39-55.
Brody, Large Area Masking Techniques-SPIE Proc., vol. 100, 1977, pp. 140-150.

*Primary Examiner*—Bernard D. Pianalto
*Attorney, Agent, or Firm*—Wenderoth, Lind & Ponack

[57] ABSTRACT

A method of producing a substrate structure for a large size display panel. The method involves conveying a transparent substrate from a transparent substrate storage means in a conveying path through a vacuum chamber, and while conveying the substrate, forming at least a patterned transparent conductive film on a surface of the substrate by depositing strips of conductive film on the substrate through a pattern containing member extending in a direction orthogonal to the substrate conveying direction and having strip forming openings therein at intervals along the lengths thereof, and storing the transparent substrates with the strips thereon at the end of the conveying path.

22 Claims, 7 Drawing Sheets

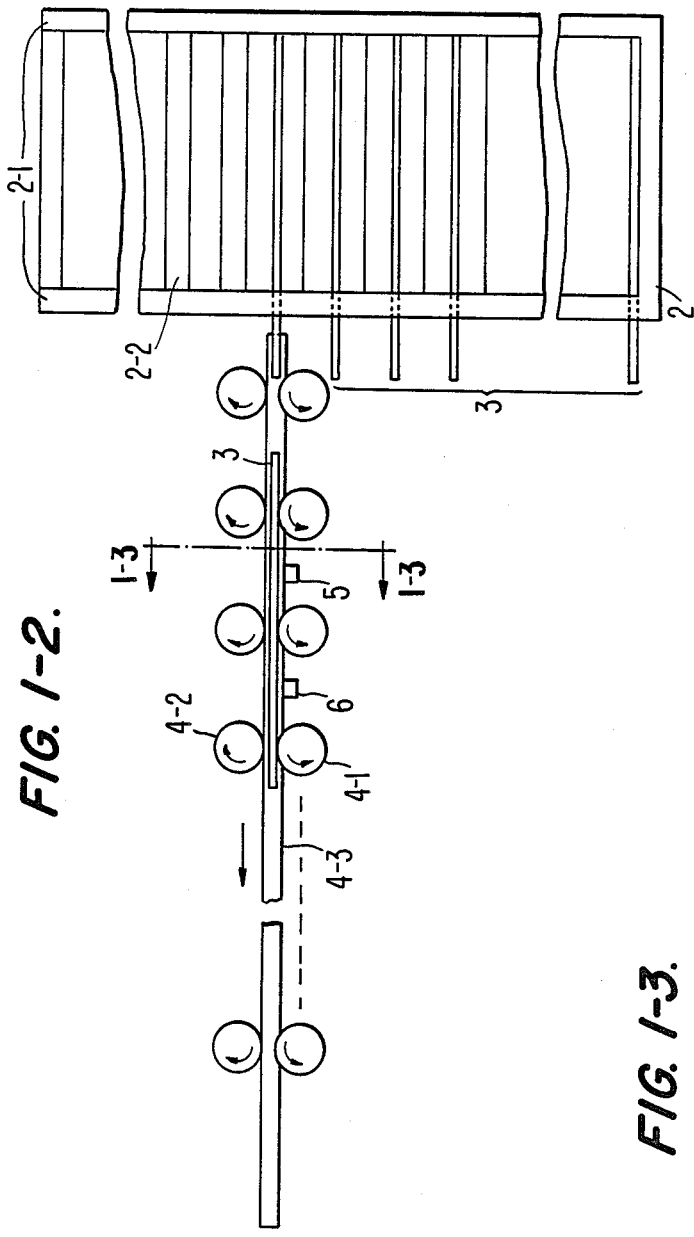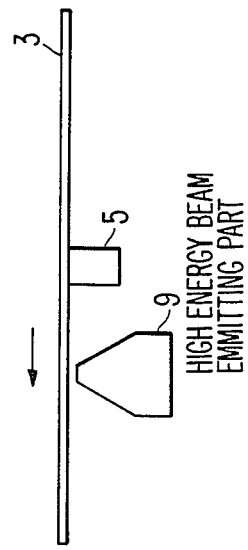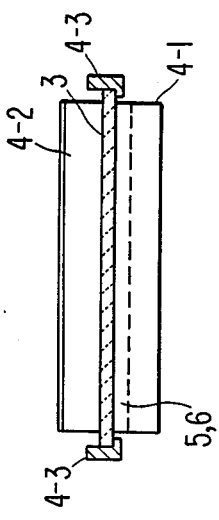

METHOD OF PRODUCING A SUBSTRATE STRUCTURE FOR A LARGE SIZE DISPLAY PANEL AND AN APPARATUS FOR PRODUCING THE SUBSTRATE STRUCTURE

BACKGROUND OF THE INVENTION

1. Field of the Invention

This invention relates to a method and apparatus for manufacturing a transparent conductive substrate for a large size display panel.

2. Description of the Prior Art

Recently intensive efforts have been concentrated on development of large size, high precision display panels of either light reception (passive) type or light emission (active) type, such as liquid crystal display (LCD), electroluminescence (EL), electrochromic display (ECD), electrophoretic display, and plasma display panel (PDP).

Above all, in an example of large capacity display panel to display a number of characters and images, upper and lower electrodes at both sides of a display medium are arranged in a X-Y matrix as shown in FIG. 15, and, for example, to display a monochromatic image of $1,000 \times 1,000$ pixels, 1,000 fine strip electrode films are required for each of X side and Y side. Usually, the electrode films of one side must be transparent conductive films in order to observe the display.

On the other hand, in the case of the display panel structure as shown in FIG. 15, regardless whether the display method is LCD, LE, ECD or PDP, it is called "a simple matrix panel structure".

To produce a simple matrix panel of large display capacity, as shown in FIG. 15, a technology to form the multiple fine strip transparent conductive films uniformly at high yield is indispensable. A conventional manufacturing method of transparent conductive substrates comprises, as shown on page 156 of The Latest Technology of Liquid Crystals by Shoichi Matsumoto et al. (first published 1983 by Kogyo Chosa Kai), the steps of forming a transparent conductive layer of indium oxide ($In_2O_3$), tin oxide ($SnO_2$) or others on a stationary or rotating transparent substrate of glass or plastics over nearly the entire surface by means of sputtering, vacuum deposition or other processes, taking out the substrate from a vacuum environment, and patterning the electrodes in desired shapes on the transparent substrate by photo etching process. In this method, electrode forming and patterning are separated from each other. In a special case, electrodes may be deposited while the substrate is covered with a metallic mask patterned in a specified shape, which is called "mask evaporation method". In this case, electrode forming and patterning can be effected simultaneously, but in the case of forming a large size substrate, tight contact of mask and substrate becomes difficult, and it may be hard to form electrode films of uniform thickness on a large area of substrate. In the case of the above photo etching process, high precision patterning is barely possible on a substrate of up to 30 cm square, but on a meterwide substrate, uniform application of photo resist, uniform exposure, and production of large size high precision photo mask are technically difficult, whereas in the case of the mask evaporation process, difficulties are found in the contact between the large substrate and mask, mechanism of replacement of high precision masks, and mass producibility. Thus, manufacture of the meter-wide transparent conductive substrate of flat display panel is an undeveloped field at the present.

On the other hand, as known well, in the simple matrix display, as the number of electrodes increases, crosstalk will cause reduction in contrast and increase in voltage in the case of the passive type, and reduction in brightness and increase in voltage in the case of the active type. To avoid such decline of display characteristics, development of a display panel called "active matrix type" has been lately activated. In the active matrix display panel, different from the panel structure in FIG. 15, one or a plurality of nonlinear resistance elements, thin film transistors or other switching elements are provided for each pixel electrode. As a result, lower voltage and higher brightness by prevention of crosstalk or extension of voltage application time can be achieved, and a high quality display can be realized even if the number of pixels is increased. The conventional manufacturing method of active matrix type display substrate is, for instance, for liquid crystals, as shown on pages 113 to 119 of The Latest Technology of Liquid Crystal by Shoichi Matsumoto et al. (first published 1983 by Kogyo Chosa Kai), a manufacturing method using the film forming a photo etching technology, and it is necessary to put and pull the substrate in and out of the vacuum environment many times when forming electrode films and semiconductor films. When patterning these films provided nearly on the entire surface into a required shape, it is required to repeat many times the photo etching process of applying the photosensitive resist and etching by mask exposure, which raises serious problems in the process cost and yield. Disregarding the cost and yield, from a different point of view, the existing semiconductor manufacturing facility may be used to produce up to A4 size panels, but when a single meter-wide display panel is desired, nothing has been completely developed as for the film uniform depositing apparatus and fine photo etching facilities (resist coater, large size photo mask making machine, uniform exposure unit, etc.).

Alternatively, a method of making active matrix substrate without using the photo etching process is known, for example, on pages 39 to 55 of "Large Scale Integration for Display Screen" Proc. of the SID, Vol. 17/1, 1976, or pages 140 to 150 of "Large Area Masking Techniques for Thin Film Transistor Arrays" SPIE Vol. 100, 1977. Here it is also attempted to make up an active matrix substrate without breaking the vacuum environment at all, by putting the substrate into an evaporating machine and replacing the deposition mask according to the sediment, or moving the deposition mask having a specified hole shape to a specified position on the stationary substrate surface by computer control and evaporating the electrode, insulation layer or semiconductor layer every time. This method does not require the photo etching process, and is excellent in that an active matrix substrate is made up by one pump down, but to form a delicate pattern it is necessary to cause the delicately processed deposition mask tightly on the substrate, and it is attempted to use a magnetic mask and achieve tight contact with the substrate by means of the magnet provided on the back of the substrate.

Hence, making of a large meter-wide substrate involves (1) Difficulty in causing the deposition mask to contact the substrate uniformly and two-dimensionally;

(2) Difficulty in making high precision, faultless two-dimensional large deposition mask (3) Difficulty in forming a uniform thickness film on a two-dimensional large area having; and (4) Complicatedness in control of replacing the deposition mask many times in the vacuum environment and forming patterned film of specified shape by gradually forming the film by setting the position of one deposition mask many times, as well as delay in manufacturing speed, thereby failing to be a manufacturing method of large size active matrix substrate suited to mass production from the the viewpoint of either facility and manufacturing processes.

Hence, at present, manufacturing method of display substrate for displaying character or graphic information of large meter size and high quality has not been developed yet, both for the simple matrix and the active matrix.

SUMMARY OF THE INVENTION

It is a primary object of this invention to provide a method of producing a substrate for a large size display panel which is higher in commercial value and lower in cost, in the light of solving the above-discussed problems, by forming electrodes or active matrix on a large size substrate by a through continuous line, and also processing, if necessary, from forming of filter layer for color display to forming of display medium layer in the same through production line.

It is another object of this invention to provide a producing apparatus using this method.

This invention provides a method of producing large size simple matrix type or active matrix type display panel substrate at low cost and at high mass producing efficiency, in which, unlike the conventional methods, a large size substrate is conveyed in a specified direction, while electrode film, insulation film, semiconductor film, passivation film, color filter film, orientation film, spacer film, display medium layer, and others are laminated in the optimum order uniformly and in patterned state, so that the substrate is nearly completed as one for display panel when stored in a storage in a continuous process. Therefore, it is not necessary to break the vacuum environment many times in the same vacuum or replace the mask, and the method is extremely suited to mass production, and a substrate for display panel with a high commercial value may be formed at low cost. In particular, as the function element for active matrix, all of MIM, p-n function, Schottkey barrier layer, thin layer varistor, thin layer transistor, MIS diode (metal-insulation layer-semiconductor), and others may be formed by using the thin layer techniques. Besides, because of the use of vacuum system, many thin layer producing methods such as vacuum deposition, sputtering, plasma CVD, plasma polymerization, plasma anodic oxidation ion plating, light excited CVD, and others may be applied, so that high function active elements can be formed. Even if the substrate is large in size, since the films are mainly formed in a thin strip or rectangular shape, the film thickness can be uniformly controlled, or tight contact between mask and substrate and uniform cutting of film can be easy. Henceforth, when manufacturing flat display panels of high function and large screen such as professional and home-use terminals of meter size, this method is extremely useful, and is expected to realize high quality, large size, flat displays for consumer and industrial uses, and to contribute to reduction of cost notably.

BRIEF DESCRIPTION OF THE DRAWINGS

FIG. 1-1(b) is a front view of a mask plate used in an electrode film patterning part of FIG. 1-1(a); FIG. 1-2 is a schematic side view of a conveying system and a substrate storage part of FIG. 1-1(a); FIG. 1-3 is a sectional view taken along a line A-A' in FIG. 1-2; FIG. 2 is a schematic side view showing a method of producing a substrate for a large size display panel in a second embodiment of this invention.

DESCRIPTION OF THE PREFERRED EMBODIMENTS

Figures 1, 1A:
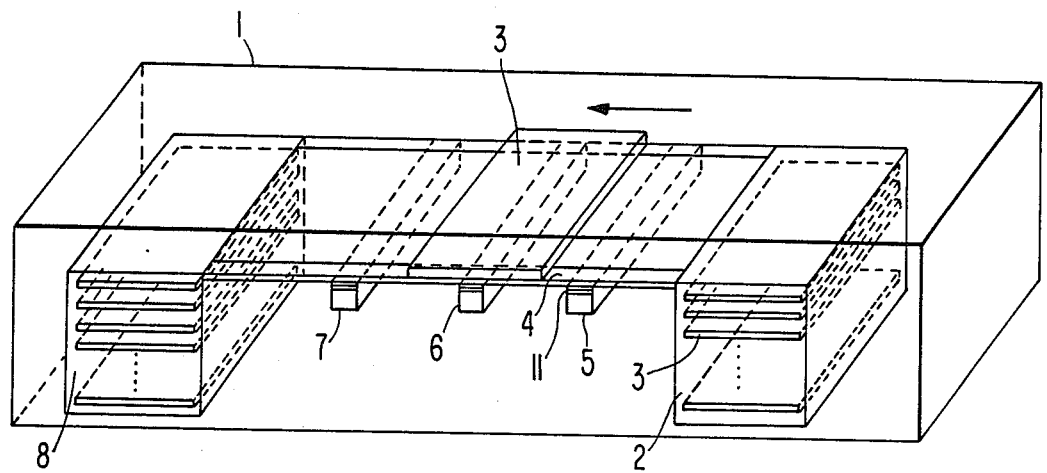
FIG. 1-1(a) shows a schematic perspective view of an apparatus using a method of producing a substrate for a large size display panel in a first embodiment of this invention.

FIG. 1 shows a first embodiment of this invention, in which a transparent substrate 3 taken out of a substrate storage 2 in a vacuum system 1 is conveyed in a direction, for example, of an arrow in the drawing by means of a high precision substrate conveying system 4 without any plan or deviation. In a direction orthogonal to the substrate conveying direction, thin film deposit parts 5, 6, 7 are provided in slit forms and fixed in the vacuum system 1.

The substrate conveying system 4 is specifically shown, for example, in FIGS. 1-2, 1-3. The substrate storage 2 is constructed so that substrate support plates 2-2 may move vertically along posts 2-1, and sends out substrates successively into the substrate conveying system 4. A substrate sent out from the substrate storage 2 is conveyed along a side guide 4-3 in the direction of the arrow by means of a pair of rotating rollers 4-1, 4-2.

Figures 1, 1B:
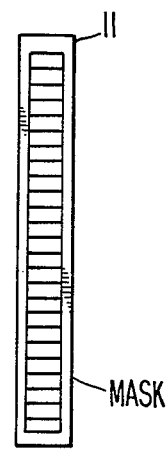

The electrode film deposit part 5 is comprised by an evaporation source of long resistance heating type, electron beam heating type or the like, and a sputtering source composed of a long target and an electrode for sputtering. While the substrate 3 is conveyed in the arrow direction, an electrode film is deposited on the lower surface of the substrate, in the drawing, by means of the electrode film deposit part 5. In FIG. 1(a), in order to deposit the electrode film and pattern the electrode, a mask plate, for example as shown in FIG. 1(b), is provided above the electrode film deposit part 5 so as to be in contact with the lower surface of the substrate 3. The vapor of the electrode film material released from the electrode film deposit part 5 can pass only through the white part in FIG. 1(b). As a result, after the substrate 3 has passed through the electrode film deposit part 5, electrically separated parallel strip electrodes are formed on the substrate 3 parallel to the conveying direction of the substrate 3. The substrate 3 provided with such patterned electrode film is stored in a substrate storage 7.

This invention, having the above construction, can form an electrode film of uniform thickness over the entire surface of the substrate, even if it is large in size, and form and pattern the electrode nearly simultaneously, without requiring photo etching process. The same technique may be applied to produce substrates for display panel with high commercial value at low cost.

As required, though not shown, a heating apparatus of substrate 3, a partition wall of conveying system 4 and storage 2 or storage 7, a position detecting mechanism of substrate, an electrode film thickness measuring system, or a plural electrode film or other thin film deposit parts 5, 6, 7 may be also provided.

Thus, in this embodiment, forming and patterning of electrode films for large size substrate can be done in a continuous process, so that high yield and low cost of mass production can be realized.

A second embodiment of this invention is explained according to FIG. 2, in which the vacuum system is not shown and only the different points from FIG. 1 are illustrated.

What is different from the configuration in FIG. 1 is that the mask 11 as shown in FIG. 1(b) for patterning the electrode film in the electrode film deposit part 5 is eliminated, and that a high energy radiation part 9 is provided behind the electrode film deposit part 5. In this embodiment, the electrode film is once formed uniformly on the substrate, and then high energy beams such as ion beams, laser beams and electron beams are emitted to specified positions on the electrode film, and the exposed electrode film parts are removed from the substrate 3, so that the electrode film is patterned.

The advantage of patterning electrode film by exposure to high energy radiation lies in that fine parations between electrodes in the order of several microns to scores of microns may be achieved, which is difficult in the masking methods as in embodiment 1.

Figure 3A:
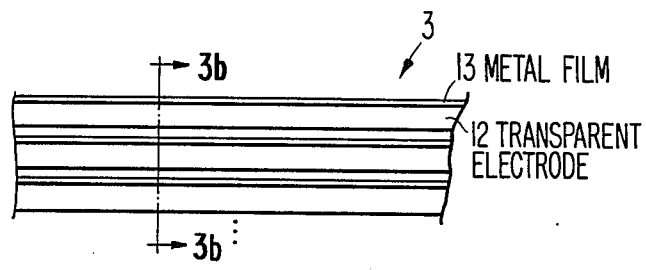
FIG. 3(a) is a front view of a display panel substrate formed in the producing method in FIG. 1.

A third embodiment of this invention is shown in FIGS. 3(a), (b). In FIGS. 1 and 2, only one material was consideredfor the electrode. Therefore, the practical limit of resistance of indium oxide or tin oxide useful as transparent conductive film is about several ohms per square. In a meter-large panel, the attenuation of signal due to this electrode resistance may cause unevenness in display, the electrode resistance must be kept as low as possible. To lower the electric resistance of the transparent electrode equivalently, a metal film such as chromium, aluminum and gold may be provided as a part of the transparent conductive film. That is, it is a feature that an electrode film deposit part 6 is provided in FIG. 2, and when the shape of electrode film patterning parts 5, 6 is set as specified, as an example is shown in sectional view in FIG. 3(b), a low resistance metal film electrode 13 is provided in a part of the surface of strip transparent electrode 12, so that reduction of resistance is achieved without largely worsening the opening rate of the strip transparent electrode 12. Thus, in this embodiment, only by placing the electrode film deposit part 6 of a different material in the midst of the conveying system 4 of the substrate 3, a practically very useful electrode substrate for a large size panel can be produced without considerably increasing the steps of the process. Meanwhile, in FIGS. 3(a), (b), a low resistance electrode film is provided behind the transparent conductive film, but it is the same in effect, needless to day, if their positions are exchanged.

Figure 3B:
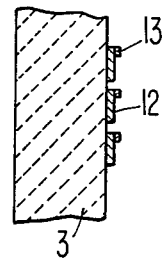
FIG. 3(b) is a sectional view taken along a line A-A' in FIG. 3(a)
Figure 4:
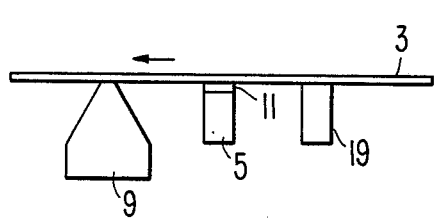
FIG. 4 is a schematic side view showing a method of producing a substrate for another large size display panel in a third embodiment of this invention.

A different embodiment of this invention is shown in FIG. 4, in which a substrate as shown in FIG. 3(b) is formed by forming a transparent conductive film and electrode film pattern, irradiating with high energy beam, and removing the metal film and transparent conductive film in specified areas. When the high energy beam is a laser beam of wavelength in a visible ray region, the transparent conductive film is low in energy absorption due to its transparency, and a large energy is required to pattern the electrode film by local heating and re-evaporation, whereas the metal film, which absorbs energy more than the transparent transparent film, is higher in the rate of using energy than in the case of transparent conductive film alone, so that patterning is possible with a smaller energy.

Figure 5A:
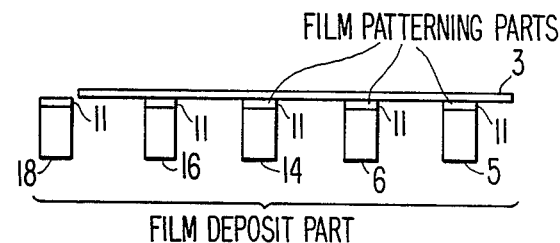
FIG. 5(a) is a schematic side view showing a method of producing a substrate for a large size color display panel with a higher commercial value according to this invention.

FIGS. 5(a), (b), (c) show a further different embodiment, which is intended to further enhance the commercial value of the substrate for display panel. That is, if, for example, the display panel is intended to display in full colors, color filters for red, green, blue and others are provided in a moasic form on the transparent conductive film, usually, and the display medium is composed to vary in the brightness in black and white. Color filters are known, among others, in the dyeing type of providing dyeing layers of gelatine, polyvinyl alcohol or the like on a transparent electrode, covering other parts than dyeing positions, and immersing in dyeing solution of specified color to dye the desired positions of the dyeing layer in specified color, the printing method of providing color filter layers by printing, electrodeposition method by electrodeposition in the pigment solution, evaporation method of evaporating coloring matters such as pigment, dyestuff and metal film, and interference filter membrane method of laminating transparent inorganic matters differing in refractive index alternately in scores of layers in specified thickness.

In this invention, basically, since the substrate is introduced into the vacuum system, it is extremely easy to install the color filter layers by evaporation method or interference filter membrane method. That is, by providing, for example, three stages of coloring matter deposit layers having masks of specified shape in correspondence to each coloring matter, the filter layers of red, green and blue may be formed in mosaic, and the mask of each coloring matter deposit part possesses a mechanical opening mechanism. Therefore, by opening or closing the mask opening part in synchronism with the conveyance of substrate, it is possible to form filter layers of different colors in the form of pixels of red, green and blue on the same electrode.

Similarly, in the interference filter membrane method, by providing plural stages of filter membrane deposit parts differing in evaporating materials alternately, it is possible to paint differently the mosaic form interference membrane color filters.

Figure 5B:
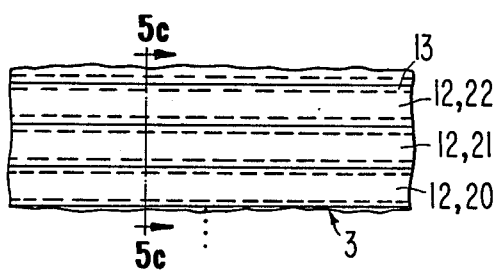
FIG. 5(b) and FIG. 5(c) are a partial front view and B-B' sectional view of the substrate with mosaic color filter produced in the embodiment in FIG. 5(a)
Figure 5C:
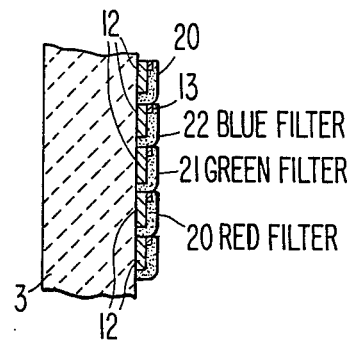

In FIG. 5 it is explained that color filters are provided on a transparent electrode, but it is generally preferable to place the transparent electrode layer on the color filter layer in order to reduce the voltage loss, and it may be easily realized by depositing the transparent electrode after forming the mosaic filter layer.

On the other hand, though omitted in the drawing, when the substrate for transparent electrode is for liquid crystal display panel, it is usually necessary to form an orientation film for aligning the liquid crystal molecules on the highest layer of the substrate. As the orientation film, organic matter such as polyimide and polyvinyl alcohol, or inorganic matter such as SiO and $SiO_2$ may be used, and these materials are usually applied to the entire surface of effective display area. For this purpose, an orientation film deposit part may be provided in the final stage of film deposit. At this time, when the orientation film is provided by oblique evaporation, the subsequent running process of orientation film may be omitted and it is very convenient. For example, in a known twice oblique evaporating orientation film forming method, when the evaporating angle with respect to the substrate surface and slit orientation film deposit part are evaporated twice at a specified angle with respect to the conveying direction of the substrate respectively, nematic liquid crystals, for example, may be disposed parallel to the substrate in a state having a uniform and small tilt angle without requiring subsequent rubbning process.

Figure 6A:
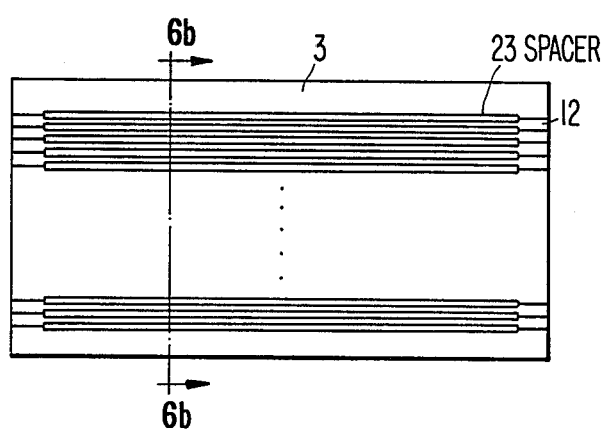
FIG. 6(a) and FIG. 6(b) are a front view and a C-C' sectional view of a substrate for a large size display panel with spacer produced according to still another embodiment of this invention.

In this invention, the deposit film is not limited to the above descriptions alone. In particular, when making up a large area panel using a large substrate, the gap precision between confronting electrodes is extremely important. In particular, in a liquid crystal display panel being composed by filling the gap between electrodes with liquid crystal or the like, the electrode gap is usually from several microns to more than ten microns, and unless a uniform gap is maintained over a wide area, uneven concentration, interference color or uneven response speed may occur, and the display panel may become useless. In this invention, in order to keep the electrode gap uniform, for example, to install filament spacers uniformly between electrodes is extremely easy. That is, similar to formation of patterned electrodes, a slit-form spacer material deposit part is provided at right angle to the substrate conveying system, and the mask in a shape to cover only the patterned electrode part is provided in the spacer material deposit part, so that spacers of specified thickness may be provided uniformly parallel to the electrode and in the space between the electrodes on the same plane, so that the commercial value of the display panel can be further increased. For example, a liquid crystal display panel is made up by gluing a pair of electrode substrate at the periphery, leaving only a gap for the spacer, to form a nearly enclosed structure, and injecting the liquid crystal from a feed port provided in part of the panel, and sealing the feed port to finish a completely enclosed structure, in which injection of liquid crystal is difficult when the spacer crosses the mutually confronting sides of the panel. Therefore, as shown in FIGS. 6(a), (b), it is necessary to control the spacer deposit so as not to provide along the entire area of the substrate by matching with the timing of transfer of panel 3. If distributed uniformly in spots, instead of linear disposition, meanwhile, the effect is the same and the injection of liquid crystal is easier.

In this manner, when insulating spacers of uniform height, being made of metal oxide or the like, are uniformly provided, in either filaments or spots, over the nearly entire surface of the display area, if the panel becomes a meter long, the electrode gap against the other opposite electrode is uniform, being defined by the thickness of spacer, and a uniform gap may be maintained over the entire surface of display area. However, it is preferable that the inside of the panel be kept at reduced pressure than the outside after filling the electrodes with display medium, and warp or unduations of the glass may be corrected, and it is easier to maintain the uniformity of gap against temperature changes. In this embodiment, it is considered to handle the substrate in plural divisions, but, needless to say, it may be handled in a continuous roll when a transparent plastic film or the like is used as substrate, or when the panel substrate manufacturing process of this disclosure is added in connection with float method, corban method, fusion method or other known thin plate glass manufacturing process.

The above description refers to manufacture of substrate for simple matrix type display panel as shown in FIG. 10, and it is also easy to produce a substrate for active matrix panel excelling in the display quality by the producing method as shown in FIG. 1. The method of producing active matrix substrate is described below.

That is, in the first electrode film forming part 5 in FIG. 1, low resistance metal films, such as Al, Cr, Ta, Ag, Au, Pt, Ni and Ni-Cr are formed in bus bar as shown in FIG. 4(a). At least, the electrode of the side to see the display must be transparent, and as the transparent electrode, coating of about 1,000 Å mainly composed of tin oxide or indium oxide is representative, and this film is provided by sputtering, evaporating or other method, as shown in FIG. 4(b), by the second electrode film deposit part 6. As one of the methods to dispose a transparent pixel electrode in a state patterned into pixels and separated individually, the substrate may be driven intermittently by using a shutter mechanism in the second electrode film forming part 6. That is, the substrate is driven intermittently by the distance corresponding to the pixel pitch, and while the substrate is moving, the electrode film deposit part closes the shutter under the mask similar to the one shown in FIG. 1(b), thereby preventing the electrode film vapor from reaching the substrate. Opening or closing of the shutter may be effected in synchronism with the conveyance of the substrate. Then, by the third thin film deposit part 7, same as in the case of forming of transparent pixel electrode mentioned above, patterns of insulation film are provided between the bus bar electrode and the pixel electrode as shown by 41 in FIG. 8. As the insulation film, $Al_2O_3$, $Ta_2O_5$, $SiO_2$, $Si_3N_4$, $Y_2O_3$, $BaTa_2O_6$ and other metal oxides or nitrides are used.

Figure 9A:
FIG. 9(a) and FIG. 10(a) respectively show examples of equivalent circuit when nonlinear element is provided for each pixel.
Figure 9B:
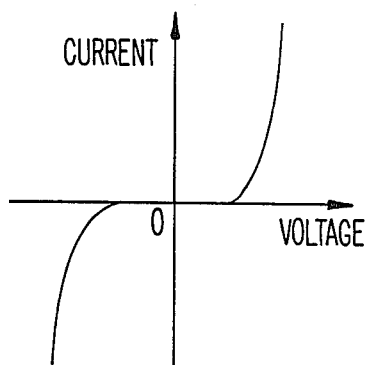
FIG. 9(b) and FIG. 10(b) respectively show examples of voltage-current characteristic by nonlinear elements of FIG. 9(a) and FIG. 10(a)
Figure 10A:
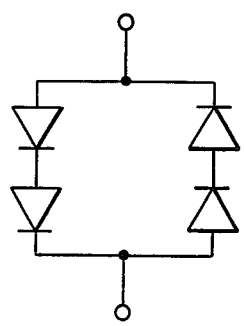
Figure 10B:
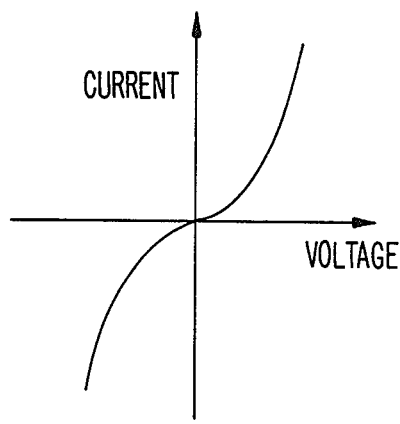

Thus, nonlinear resistance elements 41 of metal-insulator-metal (MIM) type are inserted between the bus bar electrode 39 and pixel electrode 40. Instead of accumulating insulation films, semiconductor films of CdS, CdSe, Si, Ge, Se, Te, ZnS, ZnO, $TiO_2$, Sic, $MOS_2$ and PbS may be accumulated, and depending on whether the semiconductor is of n type or p type, when the value of work function of the bus bar electrode or transparent conductive electrode is greater or smaller than the value of work function of the semiconductor, a rectifying field called Schottkey barrier is formed on the boundary of the electrode and semiconductor, so that a nonlinear resistance element may be achieved. Usually, to drive a liquid crystal or the like, it is preferable to drive the pixels by an AC voltage in order to avoid deterioration of liquid crystal, and for this purpose, it is desired that the nonlinear resistance element may exhibit a symmetrical voltage-current characteristic with respect to the voltage in the positive or negative direction. To form such nonlinear resistance elements, two diodes may be inserted in series so that the direction of rectification may be opposite to each other (back-to-back diodes), or two diodes may be inserted in parallel so that the direction of rectification may be similarly reverse to each other (ring diodes). On the other hand, when it is necessary to heighten the threshold voltage of the nonlinear resistance element depending on the characteristics of display medium, to insert a plurality of nonlinear elements in series is simple in the same manner as above. Examples of electric equivalent circuits between the sub bar electrode and the pixel electrode are shown in FIG. 9(a) and FIG. 10(a), and their voltage-current characteristics are demonstrated in FIG. 9(b) and FIG. 10(b).

Figure 8:
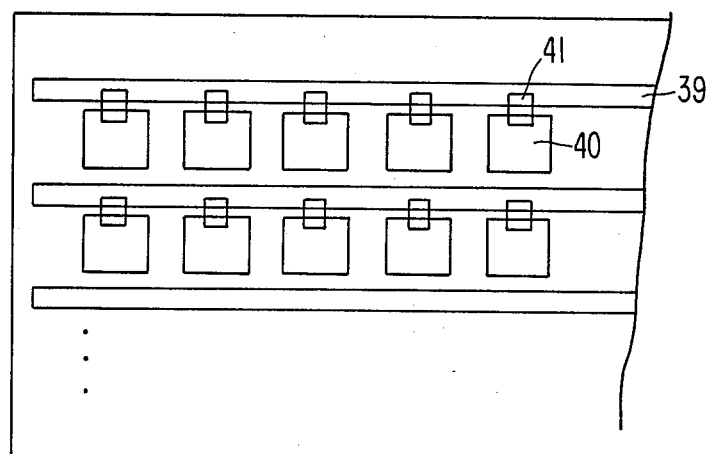
FIG. 8 is a front view of an essential part of an active matrix substrate in a further embodiment of this invention.
Figure 11:
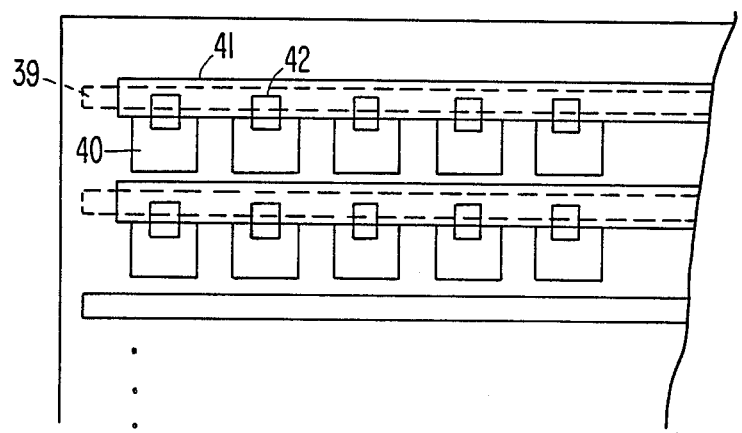
FIG. 11 is a front view of an essential part of the substrate in which vertical type nonlinear elements are introduced.

Anyway, the construction in FIG. 8 is called a horizontal nonlinear resistance element. It may be also easy to install nonlinear resistance elements of vertical type MIM, Schottkey barrier diodes, p-n junction diodes, or varistor by making use of the conductivity in the thickness wise direction of thin film, of which example is shown in FIG. 11. In this example, by accumulating the bus bar electrode 39, transparent pixel electrode 40, insulation layer 41 and third electrode layer successively by using an apparatus as shown in FIG. 1, an active matrix as shown in FIG. 11 is formed. To form all films by evaporation, incidentally, each film deposit part may be installed successively in high vacuum state, but if a gas using process coexists in the evaporation and sputtering, or plasma anodic oxidation, plasma CVD or other film forming a partition wall or a pressure slope must be provided in the vacuum system so that the substrate may be conveyed smoothly. Or the films may be accumulated sequentially by exchanging the gas in the vacuum system every time each film is provided, forcing out the gas after completely accumulating the specified films on the entire surface of substrate in specified shape, and introducing the next gas. From the viewpoint of productivity, naturally, the method of evaporation only or sputtering only is preferable.

As an example of vertical nonlinear resistance element, tantalum (Ta) or Al may be formed in the first electrode film deposit part by evaporation or sputtering as the bus bar electrode, and oxygen gas is introduced into the vacuum system, and plasma discharge is effected using the bus bar electrode as the anode, so that the surface of tantalum which is the bus bar electrode is sequentially oxidized and the surface turns to $Ta_2O_5$. The chamber is exhausted until becoming vacuum again after growth of about 100 Å of $Ta_2O_5$ or $Al_2O_3$, and the transparent electrode which is to become pixel is formed in a pattern by the second electrode film deposit part (tin oxide or indium oxide) while intermittently driving the substrate or driving continuously at low speed. Next, by the third electrode film deposit part (electrode material such as Ta, Cr, Au, and Ni-Cr), as shown in FIG. 11, a pattern is formed so as to cover part of $Ta_2O_5$ or $Al_2O_3$ and part of pixel electrode. Thus, MIM type nonlinear resistance elements may be inserted between the bus bar and each transparent pixel electrode. Or, instead of $Ta_2O_5$ or $Al_2O_3$, for example, $Bi_2O_3$, ZnO, $Bi_2O_3$ and others may be formed in three-layer film, so that a vertical thin film varistor element may be formed.

Meanwhile, when building up display panel, if the electric capacitance of nonlinear resistance element is large as compared with the pixel capacitance, a cross-talk voltage is applied also to nonselective pixel due to capacitive coupling, and the contrast is lowered. In the example in FIG. 5, in order to decrease the electric capacitance of nonlinear resistance element, a third pattern electrode film is accumulated, but when the pixel capacitance is sufficiently large, the third electrode accumulation may be omitted, and the picture element electrode may be provided to cover directly the $Ta_2O_5$ or varistor film on the bus bar. In anodic oxidation, it is preferable to keep the bus bar electrode of Ta or Al in the anode of equivalent potential, and instead of providing in strip forms over the entire substrate surface, an electrode must be provided in the direction orthogonal to the bus bar at least at one end orthogonal to the running direction, and perform anodic oxidation by plasma discharge by keeping the anode in contact with this area. When the substrate is taken out of the vacuum system and the rear end is cut off, an electrically separated bus bar electrode is obtained.

This ends the explanation of examples of placing horizontal and vertical nonlinear resistance elements on each picture element. The nonlinear resistance element is, basically, composed of two terminals, and it may be a nonlinear capacitive element in the case of Schottkey barrier or p-n junction. When nonlinear capacitive elements are connected in series to pixel, if a proper control signal is used, the ratio of the wave crest value or rms value of voltages to be applied to ON pixel and OFF pixel of matrix panel may be improved as compared with that of the simple matrix panel without nonlinear capacitive element, which may greatly contribute to improvement of display contrast. By the way, in the above explanation, the pixel electrode was a transparent body, and the pixel electrodes of upper and lower substrates must be transparent in the case of display panel using twisted nematic liquid crystal (TN liquid crystal), but only one side should be transparent electrode in the case of guest-host liquid crystal (GH liquid crystal), EL, ECD, or electrophoretic display, and in such display panel, same material may be used for bus bar electrode and pixel electrode. An active matrix display panel is achieved when the active matrix substrate as shown in FIG. 8 or FIG. 11 and the substrate posessing usual parallel strip electrode are joined so that the electrodes are orthogonal to each other, and a display medium is inserted into their gap.

Of course, as shown in FIG. 8 and FIG. 11, by using two active matrix substrates, the electrodes may be laid orthogonally to each other so that the pixels may overlap, and a medium may be inserted between them.

In this case, nonlinear elements are introduced in series to the both sides of the display medium which corresponds to one pixel.

Figure 12:
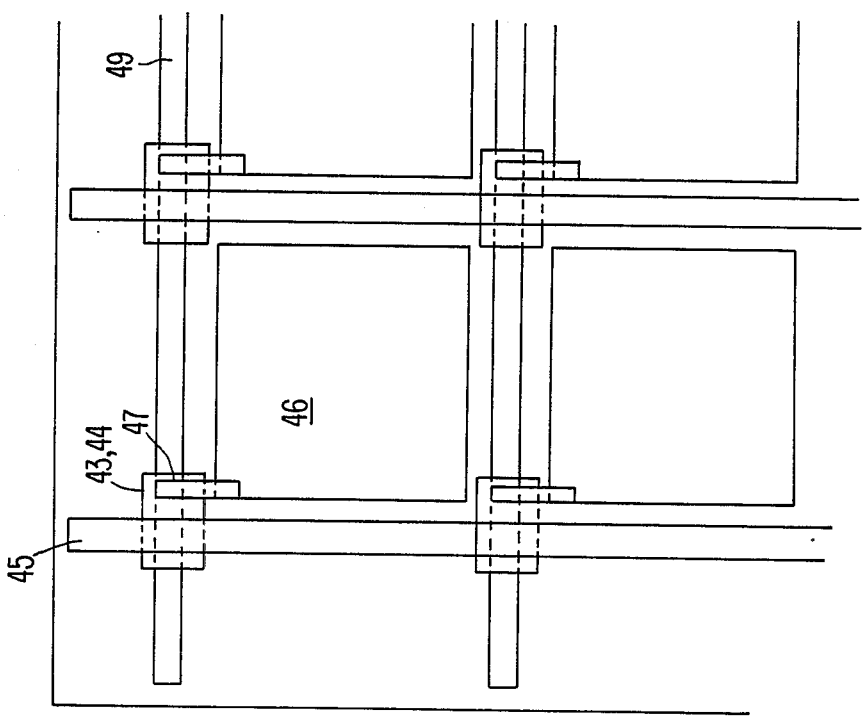
FIG. 12 is a partial front view of an active matrix substrate having thin film transistors provided for each pixel.

Next, an example of forming an active matrix substrate having three-terminal switch element such as TFT is described while referring to FIG. 12.

At the first electrode film deposit part, electrode material such as Cr, Al, Ni-Cr is provided as 49 in FIG. 12. This stripe-shaped bus bar electrode 49 becomes a gate electrode or scanning electrode.

Then, by passing through the insulation film deposit part and semiconductor film deposit part successively, patterns of crossover insulation film/gate insulation film 43 and semiconductor film 44 are accumulated as shown in FIG. 12, on the bus bar corresponding to the pixel pitches. Thereafter, the sequence of accumulation is not specified, but by accumulating signal electrode 45, pixel electrode 46 and drain electrode 47 as shown in FIG. 12, a TFT of inverted stagger type is composed in each pixel. Since the safety is insufficient if this semiconductor layer is kept exposed, the TFT is stabilized when a passivation film is provided, nearly in the same shape as the first insulation layer, or leaving only the pixel electrode, or over the entire display area where necessary, at the second insulation layer deposit part.

Figure 13:
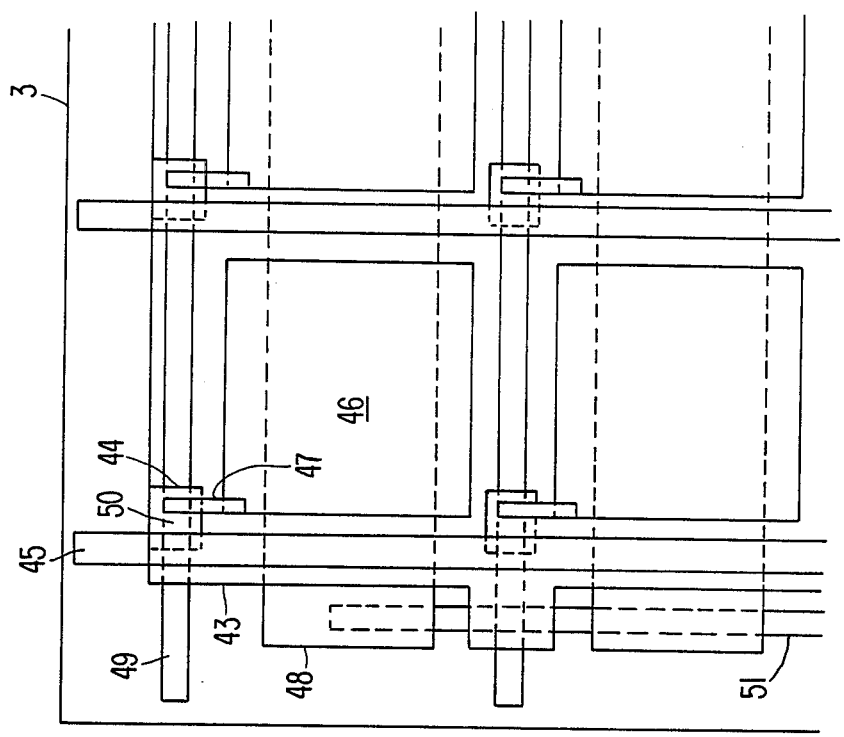
FIG. 13 is a partial front view of an active matrix substrate having parallel capacitors provided for each pixel.
Figure 14:
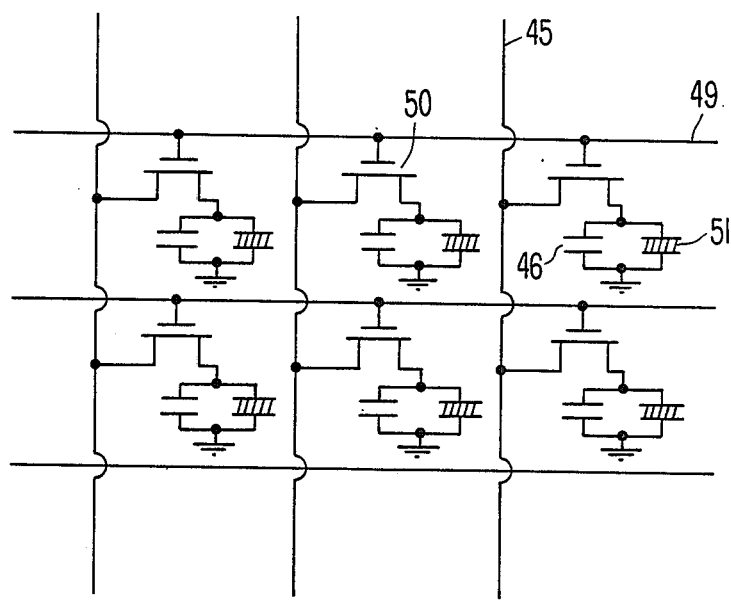
FIG. 14 is an electric equivalent circuit diagram of a display panel substrate composed by using the active matrix substrate of FIG. 13.
Figure 15A:
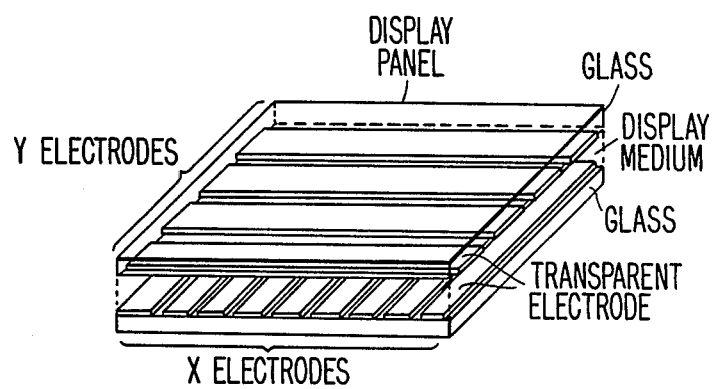
FIGS. 15(a), (b) show a structure of a conventional X-Y matrix type display panel.
Figure 15B:
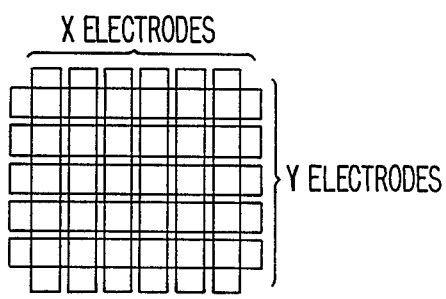

In the active matrix panel, mostly, when capacitive elements are added in parallel to the pixels, the characteristics are improved whether in the case of above twoterminal element or in this three-terminal element. This is because application of unnecessary voltage to the pixels due to pulse voltage when not selected is reduced when the pixel equivalent capacitance is kept larger than the capacitance of the nonlinear element or switching element itself, and also because the holding time of the voltage applied to the pixel when selected may be extended by the parallel capacitance, which may contribute to the low voltage drive or high speed response. An example of TFT active matrix substrate in which parallel capacity 51 is introduced is shown in FIG. 13. The difference from FIG. 12 lies in that the electrode for parallel capacitance 48 is formed simultaneously and on the same plane as the bus bar electrode 49, and that a coupling electrode 51 to coupling these electrodes 48 mutually is provided. FIG. 14 shows an electric equivalent circuit of making up display panels across the display medium of liquid crystal, EL, ECD, or electrophoretic dispersion system, between two substrates, by connecting the electrode of the other substrate than the one on which uniform electrode is provided and the electrode 51 of the substrate 3 side.

As the insulation layer used in TFT, metal oxide, nitride, or oxide or nitride of silicon, such as $Al_2O_3$, $Ta_2O_5$, $SiO_2$, and $Si_3N_4$, may be used. The layer may be formed by evaporation, sputtering, plasma anodic oxidation, or plasma CVD. On the other hand, the semiconductor layer may be made of Te, Si, CdS, CdSe, and others, and formed by thin film forming process such as evaporation, sputtering, and plasma CVD. The same materials as for insulation film are used for the passivation film. In any film forming, if it is necessary to heat the substrate in consideration of the fixing strength or electric characteristic of the film, a substrate heater may be provided in the midst of the conveying system.

Figure 6B:
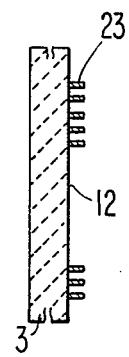
Figure 7A:
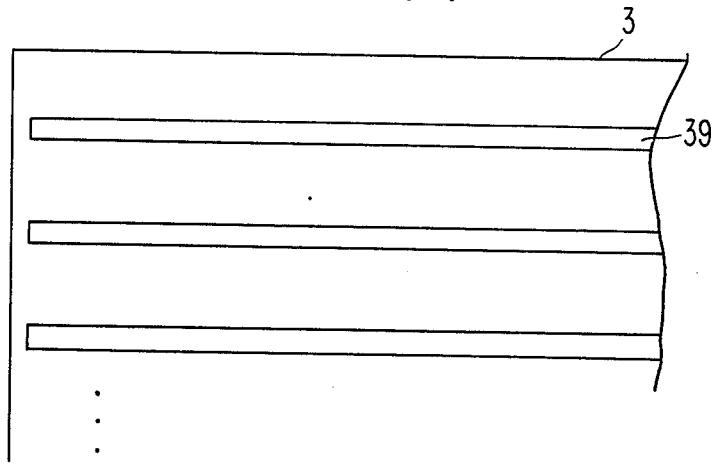
FIG. 7(a) is a partial front view of a substrate in the midst of producing active matrix substrate by using the apparatus in FIG. 1.
Figure 7B:
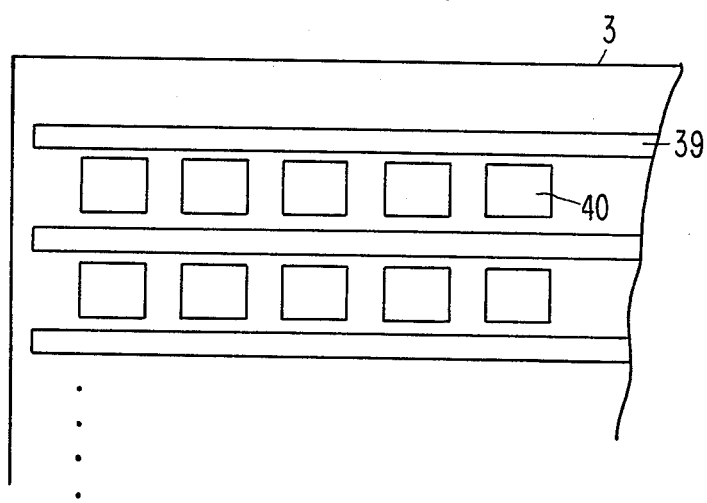
FIG. 7(b) is a front view of an essential part of the substrate in the midst of manufacture same as in FIG. 7(a)

The description so far relates to a consecutive preparation of basic active matrix substrate, and in the case of display panel which may be formed by using the vacuum system, for example ECD and EL, formation of such display medium layer may be incorporated into a serial process. For instance, an active matrix type EL panel may be produced by providing an insulation film having a sufficient withstand voltage as an interlayer insulation layer on the active matrix substrate, leaving the pixel electrode areas, as shown in FIG. 6, placing the EL layer such as ZnS:Mn in a manner to cover the pixels, and installing the electrode layer composed of metal or transparent electrode so as to cover the entire pixel region without short-circuiting the scanning bus bar or the like. This is an example of DC light emitting type EL panel, in which the EL layer made of ZnS:Mn or the like may make up a thin film AC type EL layer of sandwitch structure with insulation layers. In the case of usual EL layer, to raise the brightness, it is preferable to introduce at least two TFTs into one pixel, but only the electrode shape is slightly complicated, and basically it is possible to be produced only by slightly modifying the above process. In the case of ECD layer, instead of the above EL layer, an ECD layer of $WO_3$ or the like is provided, and after taking out the substrate from the vacuum system, an electrode or the like is inserted into the gap against the other uniform electrode substrate, so that an active matrix type ECD panel is composed.

Incidentally, also when forming an active matrix panel in the method of this invention, it is possible to form the color filter layer, spacer layer, orientation film layer or the like at the active matrix substrate side in the same manner as mentioned in the manufacturing process of display panel substrate for simple matrix.

What is claimed is:

1. A method of producing a substrate structure for a large size display panel, comprising:
   conveying a transparent substrate from a transparent substrate storage means in a conveying path through a vacuum chamber;
   while conveying the substrate within said chamber, forming at least a patterned transparent conductive film on a surface of the substrate by depositing strips of conductive film on said substrate through a pattern containing member extending in a direction orthogonal to the substrate conveying direction and having strip forming openings therein at intervals along the lengths thereof; and
   storing the transparent substrates within the strips thereon at the end of the conveying path within said chamber.

2. A method as claimed in claim 1 further comprising forming at least one further patterned conductive electrode film by depositing parts of the patterned conductive electrode film through a further pattern containing member extending in a direction orthogonal to the substrate conveying direction and having pattern part forming openings therein at intervals along the length thereof, said further pattern containing member being spaced downstream along the conveying path from said first-mentioned pattern containing member.

3. A method as claimed in claim 2 further comprising depositing color filter films on selected areas of the patterned conductive film.

4. A method as claimed in claim 2 further comprising depositing liquid crystal orienting films on said substrate.

5. A method as claimed in claim 1 further comprising depositing an insulating interelectrode spacer between the strips of said conductive film.

6. A method of producing a substrate for a large size display panel, comprising:

conveying a transparent substrate from a transparent substrate storage means in a conveying path through a vacuum chamber;

while conveying the substrate within said chamber, forming a transparent conductive film on a surface of the substrate by depositing conductive film on said substrate through a depositing member extending in a direction orthogonal to the substrate conveying direction and having a opening therein extending across the width of the substrate;

directing a high energy beam against the deposited conductive film within said chamber to leave on the substrate a desired pattern of conductive film; and storing the transparent substrate with the desired pattern of conductive film thereon at the end of the conveying path within said chamber.

7. A method as claimed in claim 6 in which the high energy beam is an ion beam.

8. A method as claimed in claim 6 in which the high energy beam is a laser beam.

9. A method as claimed in claim 6 in which the high energy beam is an electron beam.

10. A method of producing a substrate structure for a large size display panel, comprising:

conveying a transparent substrate from a transparent substrate storage means in a conveying path through a vacuum chamber;

while conveying the substrate within said chamber, forming patterned conductive films and patterned insulation films on a surface of the substrate by depositing conductive material and insulating material on said substrate through pattern containing members for the respective conductive films and insulation films and extending in a direction orthogonal to the substrate conveying direction and having pattern forming openings therein at intervals along the lengths thereof for forming on the substrate bus bars of conductive material extending in the direction in which the substrates are conveyed, pixel elements spaced at intervals along and spaced from said bus bars, and at least one functional element connected in series to each pixel element and having a non-linear resistance portion, a non-linear capacitive portion and a thin film transistor portion; and storing the transparent substrates with the conductive material thereon at the end of the conveying path within said chamber.

11. A method as claimed in claim 10 in which the step of conveying comprises conveying the transparent substrate intermittently.

12. A method as claimed in claim 11 in which at least some of the pattern parts are deposited on top of pattern parts deposited upstream in the direction of conveying of the substrate.

13. A method as claimed in claim 12 in which one of the pattern parts is a transparent electrode material taken from the group consisting of tin oxide or indium oxide.

14. A method as claimed in claim 11 further comprising, while the substrate is stopped, pumping gas into the vacuum chamber and conducting at least one depositing step.

15. A method as claimed in claim 10 in which depositing the insulating material comprises depositing a material at least partly of a material taken from the group consisting of metal oxides, metal nitrides, silicon oxides and silicon nitrides.

16. A method as claimed in claim 10 in which depositing of the conductive material comprises depositing a display element.

17. A method as claimed in claim 16 in which the display element is an electroluminescent material.

18. A method as claimed in claim 16 in which the display element is an electrochromic material.

19. A method as claimed in claim 16 further comprising depositing a color filter material on said display element.

20. A method as claimed in claim 10 further comprising depositing a liquid crystal orienting film on said substrate.

21. A method as claimed in claim 10 in which the step of depositing includes depositing insulating material in the gaps between two parts of the conductive film to form an interelectrode gap therebetween.

22. A method as claimed in claim 10 further comprising heating the substrate in connection with the deposit of at least one of the materials.

* * * * *